Figure 1:
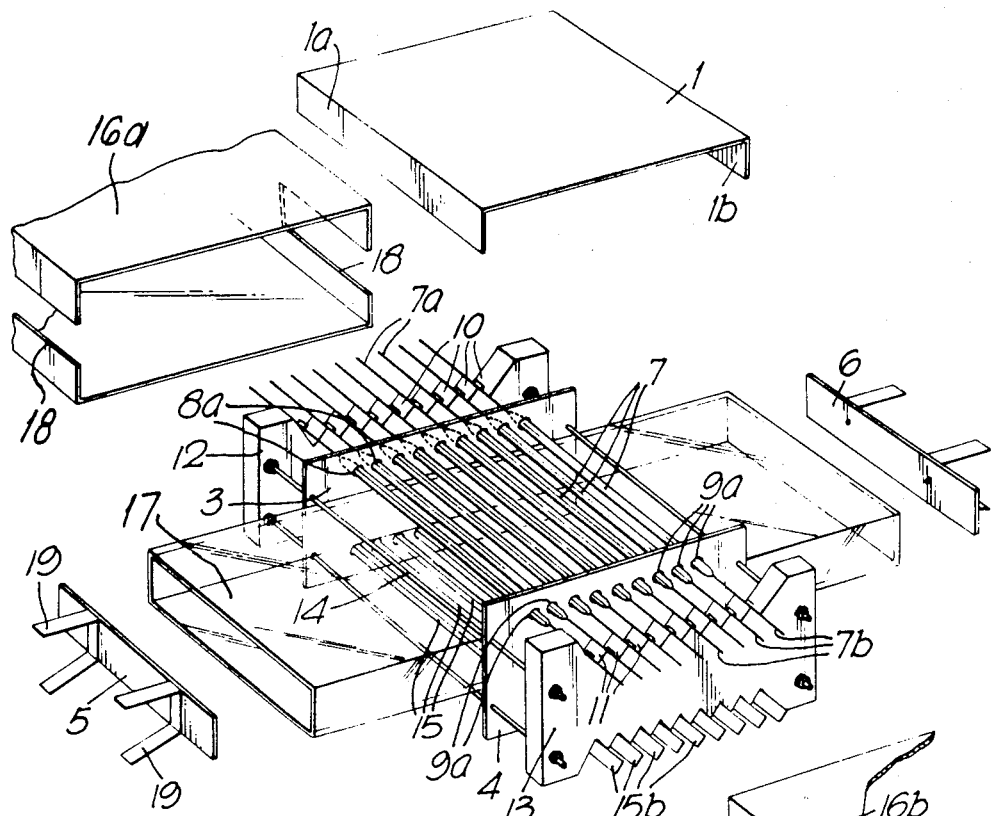

United States Patent [19]

McGinty

[11] Patent Number: 4,540,876
[45] Date of Patent: Sep. 10, 1985

[54] FURNACE SUITABLE FOR HEAT-TREATING SEMICONDUCTOR BODIES

[75] Inventor: Gordon K. McGinty, Surrey, United Kingdom

[73] Assignee: U.S. Philips Corporation, New York, N.Y.

[21] Appl. No.: 585,318

[22] Filed: Mar. 1, 1984

[30] Foreign Application Priority Data

Mar. 18, 1983 [GB] United Kingdom ................ 8307588

[51] Int. Cl.³ .......................... F27B 5/14; F27D 11/00
[52] U.S. Cl. ..................................... 219/405; 219/411; 219/290; 219/354
[58] Field of Search ............... 219/405, 411, 354, 388, 219/390, 343; 118/724, 725, 719

[56] References Cited

U.S. PATENT DOCUMENTS

| | | | |
|---|---|---|---|
| Re. 24,296 | 3/1957 | Stewart | 219/405 |
| 2,864,932 | 12/1958 | Forrer | 219/405 |
| 3,240,915 | 3/1966 | Carter | 219/405 |
| 3,305,680 | 2/1967 | Berkl | 219/343 |
| 3,313,917 | 4/1967 | Ditzler | 219/405 |
| 3,655,173 | 4/1972 | Costello | 219/388 |
| 3,836,751 | 9/1974 | Anderson | 219/354 |
| 4,101,759 | 7/1978 | Anthony | 219/411 |
| 4,164,643 | 8/1979 | Peart | 219/411 |
| 4,411,619 | 10/1983 | Darnell | 219/405 |
| 4,421,048 | 12/1983 | Adema | 219/354 |
| 4,455,479 | 6/1984 | Itoh | 219/405 |

FOREIGN PATENT DOCUMENTS 2065973 7/1981 United Kingdom ............... 219/405

*Primary Examiner*—Roy N. Envall, Jr.
*Assistant Examiner*—Teresa J. Walberg
*Attorney, Agent, or Firm*—Paul R. Miller

[57] ABSTRACT

A furnace according to the present invention includes a rectangular chamber for receiving a semiconductor wafer or other body to be heated. The chamber has six plane reflecting walls. A bank of mutually parallel, equally spaced elongated heat radiation lamps extend between two opposite sidewalls inside the chamber. The distance between the outermost lamps and two opposite sidewalls extending at the sides of the lamps is less than one and one half times, and preferably equal to one half times, the spacing between adjacent lamps. The lamps are so arranged with respect to the walls that the configuration of lamps and their images formed by reflection approximate an array of infinite size which, at least in the plane of the lamps, is approximately continuous. A semiconductor body can be heated very rapidly and uniformly in this furnace, and as such, it is particularly suitable for rapidly annealing ion-implanted semiconductor wafers.

18 Claims, 6 Drawing Figures

FURNACE SUITABLE FOR HEAT-TREATING SEMICONDUCTOR BODIES

This invention relates to a furnace particularly, but not exclusively, for heat-treating a semiconductor body in the form of a so-called 'wafer'.

In the semiconductor industry discrete electronic components and integrated circuits are formed in a thin slice or wafer of semiconductor material. At various stages during device fabrication the wafer has to be subjected to a heat-treatment. For example, in the process of locally modifying the conductivity or conductivity type of the semiconductor wafer by the well-known technique of ion-implantation the semiconductor crystal structure is damaged and the wafer then has to be subjected to a heat treatment in order to restore the crystal structure and also to activate the implanted impurities. This heat treatment is often referred to as annealing. Traditionally, the annealing process is carried out by heating the semiconductor wafer in a conventional electric oven. In order to achieve uniform annealing over the whole wafer surface and to avoid causing undue stress which in turn causes defects and distortions in the wafer undergoing the heat treatment it is important to heat the wafer uniformly. To this end it is a usual practice to introduce the wafer into the oven at a relatively low temperature, say 600° C., and slowly ramp the temperature up to the level required for annealing. However, because a conventional oven comprises components of high thermal capacity, it is not possible to change the temperature rapidly. Raising the temperature of the wafer uniformly to a sufficiently high temperature, that is to say, to about 1000° C. typically takes in the order of 30 minutes. Not only are such long heat treatments uneconomic, but they can also cause undesired diffusion and redistribution of the implanted impurity which impairs the accuracy of device fabrication, thus preventing the use of very small device dimensions and restricting the designer's freedom to specify impurity location and concentration.

In recent years much research effort has been directed to establishing new techniques for rapidly annealing ion-implanted semiconductor wafers. In particular high powered laser and electron beam have been used successfully to heat the wafer many times more quickly than is possible with a conventional oven. However, these techniques are still largely experimental, involving cumbersome and expensive equipment which is not readily transferable from the laboratory into the production environment.

British Patent Application GB No. 2,065,973A discloses a more simple and less expensive furnace apparatus which comprises a chamber for receiving the semiconductor wafer to be heated and a plurality of incoherent light sources in the form of tungsten-halogen lamps. Each lamp is sited at the area of the focus of a parabolic mirror which concentrates the radiation from the lamps onto the wafer. Unfortunately, however, it has been found that this arrangement does not heat the wafer uniformly. On the contrary, the heating effect can vary substantially—even by as much as 30%—at different locations across the wafer. Such temperature variations can have an uncontrollable effect on the electrical characteristics of the semiconductor devices being manufactured both directly, by causing non-uniform electrical activation, and indirectly by causing stress in the wafer resulting in undesired defects and distortions.

In the context of vapour deposition rather than annealing British Patent Specification No. 1,452,076 discloses a furnace having a rectangular reflecting chamber containing a bank of elongated incandescent lamps which are mounted in generally parallel relationship and extend at spaced intervals between two opposite walls of the chamber. Although an acknowledged aim in that case is to achieve uniform heating the arrangement of lamps disclosed therein does not appear to be entirely adequate in its own right because it is emphasized as being highly preferable to place the body to be heated on a thermally conductive support—a so-called "susceptor"—to help minimise thermal gradients.

According to the present invention there is provided a furnace comprising six plane reflecting walls defining a rectangular chamber for receiving a body to be heated, and a plurality of mutually parallel elongated heat radiation lamps extending between first and second opposite walls of the chamber, which lamps are equally spaced and lie in a plane parallel to third and fourth opposite walls of the chamber, characterised in that the distance between the outermost lamps and the fifth and sixth walls respectively is less than one and a half times the spacing between adjacent lamps.

In this furnace the lamps are so arranged inside the chamber with respect to the walls that the configuration of lamps and their images formed by reflection in the walls approximates to an array of infinite size and, at least in the plane of the lamps, the maximum spacing between the outermost lamps and their adjacent images is less than three times the distance between adjacent lamps. In this case the array, in the plane of the lamps, is approximately continuous. In the longitudinal direction of the lamps the images are substantially infinite in length and uninterrupted because the lamps extend all the way between the first and second walls of the chamber. Therefore, a furnace in accordance with the invention is able to provide not only very rapid but also extremely uniform heating, even to the high temperatures necessary for annealing without the need for additional measures such as placing the body to be heated on a susceptor. Moreover, this furnace is relatively inexpensive and straightforward to construct and is ideally suited for heat-treating production-size semiconductor wafers in the factory environment.

Preferably the distance between the outermost lamps and the fifth and sixth walls respectively of the chamber is substantially equal to half the spacing between adjacent lamps so that, in the plane of the lamps, the array is substantially continuous in the sense that the same equal spacing exists not only between adjacent lamps and between adjacent images, but also between the outermost lamps and their adjacent images.

The high degree of heating uniformity can be optimized if the area occupied by the lamps is at least as extensive as the body to be heated and if the spacing between adjacent lamps is less than the spacing between the lamps and the location in the chamber of the body to be heated.

The furnace may comprise only a single set of heat lamps lying in a plane parallel to the third and fourth walls of the chamber. Preferably, however, a second similarly arranged set of elongate heat lamps is also present in a plane parallel to, but spaced apart from, the first set.

An embodiment of the invention will now be described, by way of example, with reference to the accompanying drawings, in which:

FIG. 1 is an exploded, isometric view of a furnace in accordance with the invention for heat-treating a semiconductor wafer.

Figure 2:
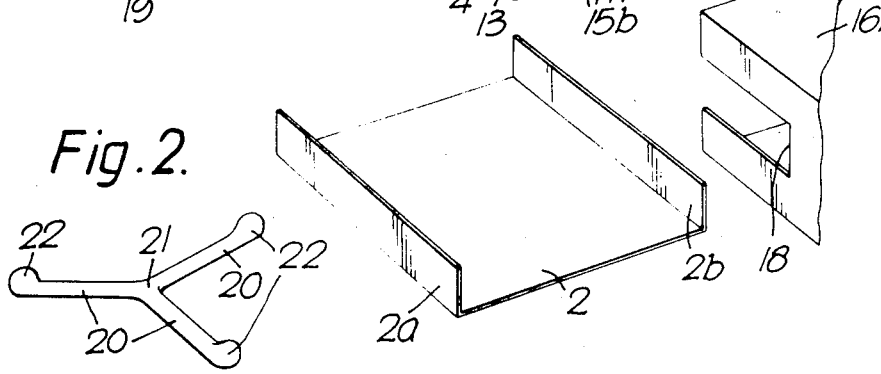
Figure 3:
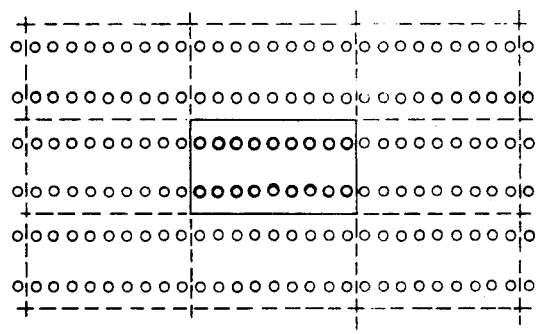
Figure 4:
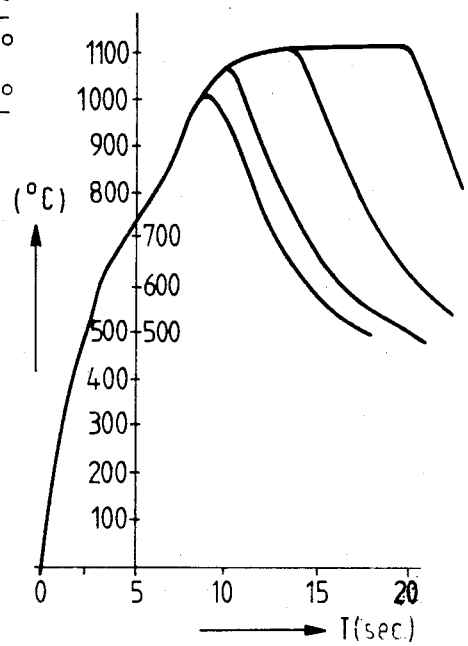
Figure 5:
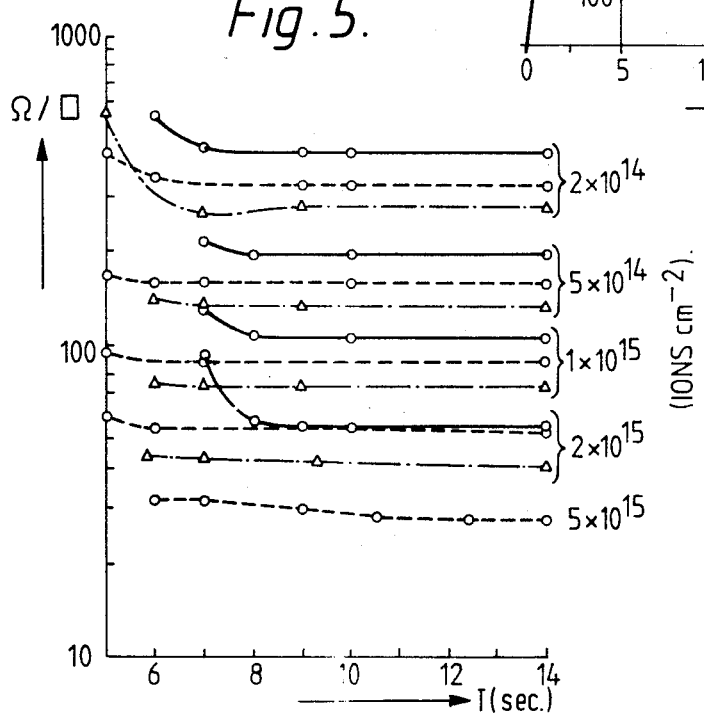
Figure 3A:
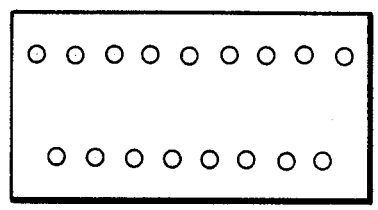

FIG. 2 is an isometric view of a carrier for introducing a semiconductor wafer into the furnace of FIG. 1, FIG. 3 is a schematic sectional view of part of the furnace of FIG. 1 showing the array of lamps and some of their reflected images, FIG. 3a is a schematic sectional view corresponding to FIG. 3 showing the arrays of lamps being offset from one another, FIG. 4 is a graph showing temperature versus time for a semiconductor wafer heated in a furnace in accordance with the invention, and FIG. 5 is a graph showing sheet resistance versus time for various ion-implanted semiconductor wafers heated in a furnace in accordance with the invention.

The furnace shown as an exploded isometric view in FIG. 1 is suitable for heat-treating semiconductor wafers and comprises a rectangular chamber for receiving the semiconductor wafer to be heated. The chamber is defined by six component parts as follows, a 145×150 mm. rectangular top wall 1 and a similar rectangular bottom wall 2 each comprising integral 29×145 mm. side wall portions 1a,1b and 2a,2b respectively at two opposite edges; two 95×150 mm. rectangular side walls 3,4 orthogonal to the side wall portions 1a,1b; and two 30×130 mm. separate side wall portions 5,6 which are co-planar with the side wall portions 1a,2a and 1b,2b respectively and which are described in more detail below, the wall portions 1a,2a,5 and 1b,2b,6 thus forming respective side walls orthogonal to the side walls 3,4. The walls of the chamber are all plane and the chamber itself is rectangular in section. With the wall dimensions given above the overall dimensions of the chamber are 145×150×95 mm. The walls are made of polished stainless steel and their inwardly-directed faces are gold-plated so that they reflect infra-red radiation.

A first set of nine heat radiation lamps 7 are present in the chamber extending between the side walls 3 and 4. The lamps 7 are mutually parallel elongate lamps which emit incoherent radiation. They are arranged in a plane array each at the same distance of approximately 15 mm. from the lamp center to the top wall 1. The lamps 7 are equally spaced and the distance between the centers of adjacent lamps is approximately 14 mm. With the dimensions given the spacing between the outermost lamps and the side wall portions 1a and 1b is 19 mm which is less than one and a half times the spacing between adjacent lamps. In an alternative embodiment the dimensions of the top and bottom walls 1,2 may be 145×140 mm and the side walls 3,4 may be 95×140 mm in which case, with the same lamp arrangement, the spacing between the outermost lamps and the side walls 1a,1b is 7 mm which is equal to half the spacing between adjacent lamps. In this case the spacing between the outermost lamps and their adjacent images is 14 mm which is the same as the spacing between adjacent lamps. In other words, in the plane of the lamps, the array is continuous. While the number of lamps is not critical to the operation of the furnace it is preferable for optimum heating uniformity that the area occupied by the set of lamps 7 is at least as extensive as the body to be heated. In the present embodiment the lamps are sufficiently long to extend through circular apertures 8a and 9a in the side walls 3 and 4 respectively. Extended spade-like terminals 7a,7b at opposite ends of each lamp 7 are located in V-shaped grooves 10 and 11 of supporting members 12 and 13 respectively and are secured against the groove walls for example with screws to provide support for the lamps 7. Electrical connections (not shown in the Figure) can be made to the terminals of each lamp in the usual way.

The supporting members 12 and 13 are made of an insulating material such at Sindanyo which is an asbestos-based composite material. They are maintained in fixed spaced relation to one another by four screw-threaded bolts 14 which extend the full width of the chamber through the side walls 3,4 and through the supporting members 12,13 themselves. Each bolt 14 is secured at both ends with two nuts in conventional manner.

The furnace also comprises a second set of nine similar heat lamps 15 extending through apertures in the side walls 3,4 and supported in V-shaped grooves in the insulating members 12,13 in exactly the same manner as and in line with the first set of lamps. This second lamp set is arranged in a plane array parallel to but spaced apart from the first set and each lamp of the second set is at the same distance of approximately 15 mm. from the lamp center to the bottom wall 2. Thus the first and second sets of lamps are mutually parallel and spaced apart by approximately 65 mm. The space between the two lamp sets, and more particularly the plane midway therebetween, is where the semiconductor wafer will be located for the heat treatment.

Suitable lamps for use in this furnace are 0.5 kW tungsten filament heat lamps currently available from Philips under Catalogue No. 13169X. These lamps comprise an elongated quartz envelope approximately 170 mm. long containing the filament and have extended spade-like terminals with several fixing holes at each end. The radiation emitted by these lamps has a peak wavelength of approximately 1.2 micrometers.

The apertures 8a,9a in the walls 3,4 are approximately 15 mm. in diameter whereas the diameter of the lamps 7,15 is only 10 mm. Thus the lamps 7,15 can be supported such that they do not contact the walls 3,4, the apertures 8a,9a providing clearance around the full circumference of the lamps. Thus a cooling atmosphere such as air can be introduced into the chamber via the apertures 8a,9a to cool the lamps. For this purpose rectangular ducts 16a and 16b made for example of aluminium are provided around the walls of the chamber in abutting relation with each other. Slots 18 are present in the side walls of the ducts 16a,16b so that they can be fitted around the sleeve 17 (described below). The cooling atmosphere is thus directed along the duct 16a, enters the chamber through the apertures 8a, and leaves via apertures 9a along the duct 16b.

The furnace also comprises an open-ended quartz sleeve 17 which is rectangular in cross-section and which is accommodated between the two sets of lamps 7,15. The open ends of the sleeve 17 are orthogonal to the apertured side walls 3,4 of the chamber and to the two sets of lamps 7,15. The sleeve 17 which is made of quartz and so is transparent to the infra-red radiation from the lamps shields the wafer to be heated from the cooling atmosphere which could cause contamination and temperature non-uniformities.

In order to minimize thermal mass so that rapid temperature changes are facilitated the semiconductor wafer which is to be subjected to the heat treatment can be inserted into the sleeve 17 supported on, for example a quartz tripod carrier of the form shown in FIG. 2. This carrier comprises three co-planar symmetrically arranged radially extending arms 20 joined at the center 21 and having raised end portions 22 which engage the semiconductor wafer to be heated and support it in a plane mid-way between the two sets of lamps 7,15 when the carrier is inserted into the quartz sleeve 17 of the furnace.

The wall portions 5 and 6 of the chamber fit slideably within the sleeve 17 which thus act as removable end stops. When the furnace is in use these end stops 5,6 are positioned so that they are approximately co-planar with the wall portions 1a,2a and 1b,2b respectively. To facilitate insertion and removal of the end stops they are provided each with two outwardly directed grips 19 formed from substantially U-shaped strips of stainless steel fastened to the wall portion, for example with screws.

When the furnace is in use the semiconductor wafer to be heated is positioned in the quartz sleeve and the heat lamps 7,15 of both sets are switched on. The inwardly directed faces of the chamber walls are all gold-plated as mentioned earlier and thus they reflect the heat radiation emitted by the lamps.

FIG. 3 shows the effect obtained when the lamps are switched on and is a schematic sectional view through the chamber of the furnace. The rectangle drawn with a continuous line at the center of the Figure represents the reflecting walls of the chamber, the circles drawn in a heavy line represent the actual infra-red lamps, and the circles drawn in lighter continuous lines represent just some of the images of the lamps formed by reflection in the walls. Clearly the images themselves will give rise to further reflected images extending in every direction so that the configuration of lamps themselves and all their images formed by reflection in the chamber walls is substantially larger than the body to be heated and approximates to an array of infinite size. In FIG. 3 the spacing between the outermost lamps and the side walls is substantially equal to half the spacing between adjacent lamps. Therefore, in the plane of the lamps the array is continuous in the sense that the same equal spacing exists (i) between adjacent lamps, (ii) between adjacent images, and (iii) between the outermost lamps and their adjacent images. It is noted that, for the sake of clarity, the quartz sleeve—which is transparent to the radiation emitted by the lamps—is not shown in this Figure.

It has been found that this arrangement enables a semiconductor wafer to be heated rapidly and with a surprisingly high degree of uniformity over the whole wafer. For example FIG. 4 shows some results obtained for a semiconductor wafer having a diameter of approximately 100 mm. and a thickness of 0.5 mm. using a furnace substantially as described above. FIG. 4 is a graph showing on the vertical axis the temperature of the semiconductor wafer and on the horizontal axis the furnace-on time. From this graph it can be seen that a 100 mm. wafer can be heated to a temperature of 1000° C. in as little as 9 seconds, to 1060° C. in 10 seconds and to 1100° C. in only 13.5 seconds. Not only are such temperatures reached remarkably quickly but the wafer temperature also falls quickly when the lamps are switched off. Thus the wafer need spend only a short time at the maximum temperature thereby minimizing dopant redistribution. Moreover, the temperature uniformity across the wafer was found to be as high as 99%.

FIG. 5 shows some actual results obtained by the present invention using the furnace described here to anneal 100 mm.-diameter wafers implanted with a range of dopants. In FIG. 5 the sheet resistance (in ohms per square) is plotted on the vertical axis against the furnace-on time (in seconds) on the horizontal axis. The solid line with solid circular points represents a boron implant at 40 keV, the broken line with the open circular points represents an arsenic implant at 180 keV, and the chain line with triangular points represents a phosphorus implant at 100 keV. Results are shown for all implants at doses of $2\times10^{14}$, $5\times10^{14}$, $1\times10^{15}$, $2\times10^{15}$ ions cm$^{-2}$ and for arsenic at $5\times10^{15}$ ions cm$^{-2}$. It is evident that in most cases full electrical activation is achieved within only a few seconds and in all cases in under approximately 11 seconds.

In the furnace arrangement described above the first set of heat lamps 7 was in registration with the second set of lamps 15 when viewed in the direction from the top wall 1 to the bottom wall 2 of the chamber. As shown in FIG. 3 this gives rise to a regular infinite array of lamps and their reflected images. However, under some circumstances it may be preferable to establish an irregular array, for example, in order to avoid localized hot-spots on the wafer. Thus in another arrangement as shown in FIG. 3a the lamps 15 of the second set, when viewed in that same direction, may be present at locations intermediate the lamps 7 of the first set.

Finally, it is noted that the embodiment described above is merely exemplary and it will be evident to the person skilled in the art that many modifications are possible within the scope of the invention. Also it is noted that a furnace in accordance with the invention may be used for heating bodies other than semiconductor wafers although it is suited especially to that particular application.

I claim:
1. A furnace comprising
   a rectangular chamber receiving a body to be heated, said chamber being defined by six plane reflecting walls completely closing said chamber in use, and
   at least one first plurality of elongated heat radiation lamps extending between first and second opposite walls of said chamber, said lamps being mutually parallel, said lamps being equally spaced apart, and said lamps lying in a plane parallel to third and fourth opposite walls of said chamber,
   wherein outermost lamps of said plurality are separated from fifth and sixth opposite walls respectively by a distance less than one and one half times a spacing between adjacent lamps.
2. A furnace according to claim 1, wherein said distance between said outermost lamps and said fifth and sixth walls respectively is substantially equal to one half said spacing between adjacent lamps.
3. A furnace according to claim 1 or claim 2, wherein said lamps occupy an area which is at least as extensive as said body to be heated.
4. A furnace according to claim 3, wherein said spacing between adjacent lamps is less than a distance between said lamps and a location in said chamber of said body to be heated.
5. A furnace according to claim 1 or claim 2, wherein said spacing between adjacent lamps is less than a distance between said lamps and a location in said chamber of said body to be heated.
6. A furnace according to claim 5, wherein a second plurality of said elongated heat radiation lamps extend in a second plane parallel to and spaced from said first plurality of elongated heat radiation lamps.

7. A furnace according to claim 1 or claim 2, wherein a second plurality of said elongated heat radiation lamps extend in a second plane parallel to and spaced from said first plurality of elongated heat radiation lamps.

8. A furnace according to claim 7, wherein said first plurality of lamps and said second plurality of lamps are each equally spaced from said third and fourth opposite walls respectively.

9. A furnace according to claim 7, wherein said second plurality of lamps is present at locations intermediate to said first plurality of lamps when viewed in a direction from said third wall to said fourth wall.

10. A furnace according to claim 7, wherein said lamps extend through apertures in said first and second opposite walls.

11. A furnace according to claim 1 or claim 2, wherein said lamps extend through apertures in said first and second opposite walls.

12. A furnace according to claim 11, wherein said apertures have a larger diameter than said lamps.

13. A furnace according to claim 12, wherein said apertures communicate with duct means for providing a cooling atmosphere for said lamps in said chamber.

14. A furnace according to claim 13, wherein said body to be heated is shielded by an open-ended sleeve from said cooling atmosphere, said sleeve being transparent to heat radiation from said lamps.

15. A furnace according to claim 14, wherein said chamber includes a reflecting wall portion which forms removable end stops for said sleeve.

16. A furnace according to claim 15, wherein said removable end stops fit slidably within said sleeve, said end stops being approximately coplanar with said fifth and sixth opposite walls.

17. A furnace according to claim 1 or claim 2, wherein said body to be heated is a semiconductor body undergoing a heat treatment.

18. A furnace according to claim 1 or 2, wherein said plane reflecting walls are gold plated in a direction facing said body to be heated.

* * * * *